(12) United States Patent
Zhu et al.

(10) Patent No.: US 11,482,501 B2
(45) Date of Patent: Oct. 25, 2022

(54) AMPLIFIER HAVING IMPROVED STABILITY

(71) Applicant: Ampleon Netherlands B.V., Nijmegen (NL)

(72) Inventors: Yi Zhu, Nijmegen (NL); Josephus Henricus Bartholomeus Van Der Zanden, Nijmegen (NL); Rob Mathijs Heeres, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 17/620,462

(22) PCT Filed: Jun. 19, 2020

(86) PCT No.: PCT/NL2020/050401
§ 371 (c)(1),
(2) Date: Dec. 17, 2021

(87) PCT Pub. No.: WO2020/256554
PCT Pub. Date: Dec. 24, 2020

(65) Prior Publication Data
US 2022/0246553 A1 Aug. 4, 2022

(30) Foreign Application Priority Data
Jun. 19, 2019 (NL) .................................... 2023348

(51) Int. Cl.
*H03F 3/191* (2006.01)
*H01L 23/66* (2006.01)
(Continued)

(52) U.S. Cl.
CPC .............. *H01L 23/66* (2013.01); *H01L 25/16* (2013.01); *H03F 1/565* (2013.01); *H03F 3/193* (2013.01);
(Continued)

(58) Field of Classification Search
CPC ......... H01L 23/66; H01L 25/16; H01L 24/48; H01L 2223/6611; H01L 2223/6655;
(Continued)

(56) References Cited

U.S. PATENT DOCUMENTS

2008/0246547 A1 10/2008 Blednov

FOREIGN PATENT DOCUMENTS

| KR | 100878708 B1 | 1/2009 |
| WO | 2006006119 A1 | 1/2006 |

OTHER PUBLICATIONS

International Preliminary Report on Patentability, Application No. PCT/NL2020/050401, dated Jun. 1, 2021, 10 pages.
(Continued)

*Primary Examiner* — Khanh V Nguyen
(74) *Attorney, Agent, or Firm* — McDonnell Boehnen Hulbert & Berghoff LLP

(57) ABSTRACT

Example embodiments relate to amplifiers having improved stability. One example amplifier includes a conductive substrate, an input terminal arranged spaced apart from the conduct substrate, a first bondwire attachment structure electrically connected to or integrally formed with the input terminal, a first input matching capacitor having a non-grounded terminal and a grounded terminal, a second bondwire attachment structure electrically connected to the non-grounded terminal of the first input matching capacitor, a first semiconductor die on which a radiofrequency power transistor is arranged that has an output electrically connected to a fourth bondwire attachment structure, an output matching capacitor having a non-grounded terminal and a grounded terminal (the non-grounded terminal being electrically connected to a fifth bondwire attachment structure), an output terminal arranged spaced apart from the conductive substrate, a sixth bondwire attachment structure elec-
(Continued)

trically connected to or integrally formed with the output terminal, and multiple bondwire assemblies.

20 Claims, 10 Drawing Sheets

(51) Int. Cl.
*H03F 3/193* (2006.01)
*H03F 1/56* (2006.01)
*H01L 25/16* (2006.01)
*H01L 23/00* (2006.01)

(52) U.S. Cl.
CPC ....... *H01L 24/48* (2013.01); *H01L 2223/6611* (2013.01); *H01L 2223/6655* (2013.01); *H01L 2224/48137* (2013.01); *H01L 2224/48195* (2013.01); *H03F 2200/222* (2013.01); *H03F 2200/451* (2013.01)

(58) Field of Classification Search
CPC . H01L 2224/48137; H01L 2224/48195; H01L 2924/3011; H03F 1/565; H03F 3/193; H03F 2200/222; H03F 2200/451; H03F 3/191; H03F 1/56; H03F 3/195
USPC .......................................... 330/277, 302, 307
See application file for complete search history.

(56) References Cited

OTHER PUBLICATIONS

International Search Report and Written Opinion, Application No. PCT/NL2020/050401, dated Sep. 7, 2020, 12 pages.

AMPLIFIER HAVING IMPROVED STABILITY

CROSS-REFERENCE TO RELATED APPLICATIONS

The present application is a national stage entry of PCT/NL2020/050401 filed Jun. 19, 2020, which claims priority to NL 2023348 filed Jun. 19, 2019, the contents of each of which are hereby incorporated by reference.

The present application relates to an amplifier. It further relates to an electronic device comprising the same. The present application particularly relates to radiofrequency, 'RF', amplifiers. For example, the operational frequency of the amplifier may lie in a range between 100 MHz and 40 GHz.

Amplifiers of the type described above are well known in the art. These types of amplifiers are often used in base stations for mobile telecommunications. An example is shown in FIG. 1. The equivalent circuit of this amplifier is shown in FIG. 3. It is noted that the reference signs used below either refer to the physical structures shown in FIG. 1 or 2, and/or the equivalent electrical components shown in FIG. 3. For example, reference sign L1 will be used to refer to a bondwire assembly, i.e. a physical structure, and to refer to the equivalent electrical component of that assembly being an inductor L1. Furthermore, L1 may also be used to denote the inductance value of inductor L1. Similar considerations hold for the other figures referred to in this document.

In FIG. 1, an amplifier 100 is shown having a conductive substrate 9 on which a first semiconductor die 5 is arranged. A radiofrequency power transistor Q1 is arranged on this die. Transistor Q1 has an input and an output electrically connected to a third bondwire attachment structure, 'BAS', B3 and a fourth BAS B4, respectively. Within the context of the present invention, a bondwire attachment structure may comprise a bondpad, a bondbar, an assembly of bondpads, or any other structure for mounting one or more bondwires.

Amplifier 100 further comprises an input terminal 10 arranged spaced apart from conductive substrate 9. Typically, an electrically isolating spacer 8 is used in the form of a ceramic ring or a solidified molding compound. Furthermore, as illustrated in FIG. 4, input terminal 10 may also penetrate through spacer 8. In this case, e.g. when amplifier 100 comprises a solidified molding compound as spacer 8, an upper part 8' of spacer 8 may be identified that covers at least part of input terminal 10. Other materials to be used for spacer 8 are not excluded. Similarly, amplifier 100 comprises an output terminal 11 that is arranged spaced apart from conductive substrate 9.

A first BAS B1 is electrically connected to or integrally formed with input terminal 10. For example, input terminal 10 can be in the form of a lead of which a segment is used as first BAS B1. This latter segment may correspond to an inner segment of the lead that is kept free from molding compound. Similarly, a sixth BAS B6 is provided that is electrically connected to or integrally formed with output terminal 11.

Amplifier 100 further comprises a first input matching capacitor C1 having a non-grounded terminal and a grounded terminal. A second BAS B2 electrically connects to the non-grounded terminal of the first input matching capacitor.

Amplifier 100 also comprises an output matching capacitor C2 having a non-grounded terminal and a grounded terminal, wherein the non-grounded terminal is electrically connected to a fifth BAS B5.

A first bondwire assembly L1 is used for providing an electrical connection between first BAS B1 and second BAS B2. A second bondwire assembly L2 is used for providing an electrical connection between second BAS B2 and third BAS B3. A third bondwire assembly L3 extends between fourth BAS B4 and fifth BAS B5 and provides an electrical connection between fourth BAS B4 and fifth BAS B5. A fourth bondwire assembly L4 is used for providing an electrical connection between fourth BAS B4 and sixth BAS B6.

In this known layout, output capacitor C2, which as shown in FIG. 3 is in series with L3, acts as a short circuit at the operational frequency of amplifier 100, e.g. 1 GHz. At this frequency, L3 will therefore be parallel with the intrinsic output capacitance of transistor Q1, i.e. Cds. By properly choosing the value for L3, it can be achieved that at or close to the operational frequency, L3 and Cds will resonate thereby displaying a high impedance to ground at the output of transistor Q1. Put differently, L3 can be designed such that at the operational frequency, the negative consequences of Cds, such as lower power added efficiencies, can be mitigated.

FIG. 2 illustrates a further example of a known amplifier 200. Amplifiers 100 and 200 differ in that in amplifier 200, L3 extends from the output of transistor Q1 back towards input terminal 10, whereas in amplifier 100, L3 extends from the output of transistor Q1 towards output terminal 11. Moreover, in amplifier 100, capacitor C2 is integrated on a separate die 7, such as a semiconductor die or a ceramic die, whereas in amplifier 200 it is integrated on the same semiconductor die as transistor Q1, i.e. first semiconductor die 100.

In both amplifiers 100, 200, C1 is integrated on a die 6 separate from die 5. Also die 6 can be in the form of a semiconductor die or a ceramic die.

In amplifier 200, the following holds with respect to the placement of the various bondwire attachment structures. In a direction from input terminal 10 to output terminal 11, second BAS B2 is arranged in between first BAS B1 and third BAS B3, fifth BAS B5 is arranged in between second BAS B2 and fourth BAS B4, and fourth BAS B4 is arranged in between fifth BAS B5 and sixth BAS B6.

Compared to amplifier 100, amplifier 200 displays an improved performance in terms of efficiency. This is mainly due to the reduced electromagnetic coupling between L3 and L4 as they are no longer in parallel and/or close proximity as with amplifier 100.

Despite the improved performance, amplifier 200 does have drawbacks. The Applicant has found that amplifiers of the type as amplifier 200, i.e. in which L3 extends from the output of the transistor towards the input terminal, suffer from an increased risk for instability.

An amplifier as defined by the preamble of claim 1 is known from US 2008246547A1. A further amplifier is known from KR 100878708B1.

An object of the present invention is to provide an amplifier of the type as amplifier 200 having a reduced risk for instability.

According to the invention, this object is achieved using the amplifier as defined in claim 1 which is characterized in that the amplifier further comprises a second input matching capacitor having a non-grounded terminal and a grounded terminal, wherein the non-grounded terminal is connected to a seventh BAS. Furthermore, the amplifier comprises an electrical connection between the seventh BAS and the input of the radiofrequency power transistor. According to the invention, the second bondwire assembly extends between the second BAS and the seventh BAS, and the seventh BAS is arranged, in the direction from the input terminal to the output terminal, in between the first BAS and the second BAS.

According to the invention, an inductance associated with the second bondwire assembly is greater than an inductance associated with the electrical connection.

According to the invention, a two or more stage input matching network is used with a particular positioning of the bondwire attachment structures that are coupled to the non-ground terminals of the capacitors of this input matching network. Due to this arrangement, the coupling coefficients describing the electromagnetic coupling between the inductive elements in the input matching network, e.g. the various bondwire assemblies and the electrical connection, and the third bondwire assembly L3 are different for the various inductive elements. For example, L1 and the electrical connection may both have a positive coefficient, and L2 may have a negative coefficient, or vice versa. Hence, due to the arrangement of bondwire attachment structures in the input matching network, the effective electromagnetic coupling between the inductive elements in the input matching network and the third bondwire assembly is effectively reduced. The Applicant has found that this reduction improves the stability of the amplifier.

In the amplifier described in KR 100878708B1, the inductance of the electrical connection, which is embodied in this document as a bondwire assembly, is much greater than the inductance of the second bondwire assembly. Similar to this known amplifier, the present invention uses L-C networks for matching impedances. More in particular, the difference between the impedance seen looking towards the radiofrequency power transistor at the input terminal of the amplifier, e.g. 50 Ohm, and the impedance looking into the input of the radiofrequency power transistor, e.g. typically a very low complex impedance, is overcome by using several L-C impedance matching stages that each comprise a shunt capacitor followed by a series inductor.

In general for such a matching stage, assuming that the series inductor L is coupled to ground via a real load R1, the admittance seen looking towards the load at the non-grounded terminal of the shunt capacitor C equals:

$$Y = j\omega C + \frac{1}{j\omega L + R1} \quad \text{equation 1}$$

Choosing the following particular combination of C and L allows the imaginary parts of Y to cancel:

$$C = \frac{L}{\omega^2 L^2 + R1^2} \quad \text{equation 2}$$

The impedance seen at the non-grounded terminal of C1 looking towards R1 should match R0, i.e.:

$$R0 = \frac{\omega^2 L^2 + R1^2}{R1} \quad \text{equation 3}$$

A general problem for high power transistors is the relatively low input impedance. It is a well recognized problem that in order for the transistor to be properly matched, the impedance must already be transformed to higher values inside the package. By inspecting equation 3 above, it can be seen that a high inductance is therefore preferred as this will increase R0. As taught by KR 100878708B1, in order to perform the desired impedance transform, it is preferred to realize a high inductance value using the bondwires that are connected to the input of the radiofrequency power transistor. More in particular, KR 100878708B1 discloses a two-stage matching network in which the inductance associated with the bondwires that are connected to the input of the radiofrequency power transistor is much greater than the inductance associated with the bondwires of the preceding matching stage.

Contrary to the teaching above, the present invention stipulates that an inductance associated with the second bondwire assembly is greater than an inductance associated with the electrical connection. Here, the electrical connection corresponds to the inductance that is connected to the input of the radiofrequency power transistor. The Applicant has found that the particular arrangement of bondwire attachment structures in combination with the inductance of the electrical connection relative to the inductance of the second bondwire assembly improves the stability of the amplifier while at the same time allowing a proper impedance match.

An inductance of the electrical connection is preferably such that an impedance transformation ratio between the real part of an impedance seen looking into the electrical connection towards the radiofrequency power transistor and the real part of an impedance looking into an input of the radiofrequency power transistor is less than one fifth of an impedance transformation ratio between the real part of an impedance seen looking into the second bondwire assembly towards the radiofrequency power transistor and the real part of an impedance looking into an input of the radiofrequency power transistor, preferably less than one tenth. The radiofrequency power transistor is preferably realized in Silicon based laterally diffused metal-oxide semiconductor, 'LDMOS', transistors or as a Gallium Nitride based high electron mobility transistors, 'HEMT'. Additionally or alternatively, a total gate width of the radiofrequency power transistor is preferably larger than 1 mm, and an operational frequency of the amplifier preferably lies in a range between 100 MHz and 40 GHz, and wherein an output power of the amplifier exceeds 50 W.

The present invention is not limited to a two-stage input matching network. Additional stages can be added. Nevertheless, it is preferred to maintain the positioning of bondwire attachment structures in the final two stages as described above.

The amplifier is preferably designed to be operable in an operational frequency band, wherein the series connection of the output matching capacitor and the third bondwire assembly is configured to resonate with an output capacitance of the radiofrequency power transistor at or near an operational frequency within the operational frequency band. As described above, this will mitigate the impact of the output capacitance on the RF performance of the amplifier. However, the output capacitance could equally be used as a capacitor for an impedance matching network in cases where the third bondwire assembly would not resonate at or close to the operational frequency with the output capacitance. Even in these cases, the reduced electromagnetic coupling may improve the stability of the amplifier.

The first bondwire assembly may extend between the first BAS and the second BAS. In this case, the input matching network may relate to a two-stage matching network. Additionally or alternatively, the fourth bondwire assembly may extend between the fourth BAS and the sixth BAS. In this case, the output of the transistor is directly coupled to the output terminal of the amplifier. In other embodiments, further impedance matching stages may be provided between the output of the transistor and the output terminal of the amplifier.

The amplifier may further comprise a second die. This die is preferably a semiconductor die or a ceramic die although it may also include a thin film technology device in which one or more passive components are integrated. On the second die, the first input matching capacitor and the second input matching capacitor may be integrated. Alternatively, the amplifier may further comprise a second die, preferably a semiconductor die or a ceramic die, and a third die, preferably a semiconductor die or a ceramic die, on which the first input matching capacitor and the second input matching capacitor are integrated, respectively. Also here, the second and third die may be realized in other technologies for realizing passive components. Alternatively, the amplifier may further comprise a second die, preferably a semiconductor die or a ceramic die, on which the second input matching capacitor is integrated, wherein the first input matching capacitor is integrated on the first semiconductor die.

For the embodiments described above, the output matching capacitor may be integrated on the second die. Alternatively, the amplifier may comprise a fourth die, preferably a semiconductor die or a ceramic die, on which the output matching capacitor is integrated. In this case, the fourth die may be arranged in between the second die and the first semiconductor die. In yet another embodiment, the output matching capacitor is integrated on the first semiconductor die.

The amplifier may further comprise a third input matching capacitor having a grounded terminal and a non-grounded terminal that is connected to an eighth BAS, wherein the first bondwire assembly comprises first bondwires extending between the first BAS and the eighth BAS and second bondwires extending between the eighth BAS and the second BAS. In this manner, a third matching stage can be realized. The third input matching capacitor can be integrated on the second die or the first semiconductor die.

The output matching capacitor can be integrated on the first semiconductor die. Additionally or alternatively, the second input matching capacitor can be integrated on the first semiconductor die.

The first input matching capacitor, the second input matching capacitor, and the output matching capacitor can be integrated on the first semiconductor die.

When the second input matching capacitor is integrated on the first semiconductor die, the electrical connection may comprise a metal track arranged on the first semiconductor die, such as a transmission line, that extends from the non-grounded terminal of the second input matching capacitor to the input of the radiofrequency power transistor.

The input of the radiofrequency power transistor can be electrically connected to a third BAS, and the electrical connection may comprise a fifth bondwire assembly extending between the seventh BAS and the third BAS. The second BAS can be arranged in between the first BAS and the third BAS. Additionally or alternatively, the second bondwire assembly may extend between the second BAS and the third BAS.

The fifth BAS may be arranged, in the direction from the input terminal to the output terminal, in between the third BAS and the fourth BAS. However, the third BAS may also be arranged, in the direction from the input terminal to the output terminal, in between the fifth BAS and the fourth BAS. In this latter case, the coupling coefficient for the electromagnetic coupling between L5 and L3 may be increased. Such configuration would for example allow a strong coupling between L2 and L3 to be at least partially compensated.

A height of the second bondwire assembly relative to the substrate can be greater than a height of the fifth bondwire assembly relative to said substrate, at least by 20 percent, and more preferably by at least 30 percent, for the purpose of reducing the effective electromagnetic coupling between the first, second, and fifth bondwire assemblies on one hand and the third bondwire assembly on the other hand so as to improve the stability of the amplifier. As described before, the coupling coefficient between L2 and L3 on the one hand, and the coupling coefficients between L1 and L3, and L5 and L3, on the other hand, are opposite in sign. By varying the shape of L2, more in particular by using a larger bondwire height and/or using longer wires, the coupling coefficient of this bondwire assembly, which is farther removed from L3 than L5, can be increased. This would allow a better compensation of the electromagnetic coupling between L1 and L3 and between L5 and L3.

At least one of the first, second, third, fourth, and fifth bondwire assemblies may comprise one or more bondwires that are bonded on opposing ends thereof to a respective bondwire attachment structure.

The amplifier may be a packaged amplifier having an input lead or input pad connected to or integrally formed with the input terminal and an output lead or output pad connected to or integrally formed with the output terminal. For example, the input terminal and the substrate and the output terminal and the substrate could be fixed in a spaced apart manner by an electrically isolating spacer. Such spacer may be comprised of a solidified molding compound.

The packaged amplifier may further comprise a lid that is fixedly connected to the input terminal and output terminal or to the spacer. Together, the lid and substrate define a cavity in which at least the first semiconductor die is arranged. More preferably, all the dies in the package are arranged in the cavity, as well as the required bondwire assemblies.

Alternatively, at least the first semiconductor die is encapsulated by the solidified molding compound. More preferably, all the dies in the package as well as the required bondwire assemblies are encapsulated by the molding compound. In such case, the molding compound also defines the outer appearance of the device.

At least one of the first, second, third, fourth, fifth, sixth, and seventh BAS may comprise a bondpad or a bondbar.

The present invention also relates to an electronic device comprising the amplifier as described above. For example, the electronic device may comprise a Doherty amplifier having a main amplifier and a peak amplifier, wherein each of the main amplifier and the peak amplifier comprises an amplifier as described above. The present invention does not exclude embodiments wherein the main and peak amplifiers are integrated on a single die or multiple dies in the same package. In such case, the input matching networks and output matching network may be separately provided for each of the main and peak amplifiers, and the package may comprise respective input and output terminals for the main and peak amplifiers. In addition, the present invention does not exclude multi-way Doherty amplifiers comprising two or more peak amplifiers. Furthermore, the Doherty amplifier may be symmetrical, in which the main and peak amplifiers have substantially the same power capacity, or asymmetrical, in which the power capacities are different.

The electronic device comprising the Doherty amplifier may further comprise a splitting element for splitting an input signal into respective input signal parts, each input signal part being fed to a different amplifier among the main amplifier and the peak amplifier. In addition, the electronic device may comprise a phase shifting element arranged between the splitting element and one of the main amplifier and the peak amplifier, and a combining element for combining signals outputted by the main amplifier and the peak amplifier. Furthermore, the electronic device may comprise an impedance inverter arranged between the other of the main amplifier and the peak amplifier and the combining element. The phase shifting element and the impedance inverter are configured to allow the signals amplified by the main amplifier and the peak amplifier to add in-phase at the combining element.

The electronic device described above may comprise a printed circuit board on which the main amplifier and peak amplifier are mounted, and on or in which the splitting element, the phase shifting element, the combining element, and/or the impedance inverter, are at least partially arranged. Furthermore, the impedance inverter may comprise a transmission line having a length that is electrically equivalent to a quarter wave length at or near an operational frequency within an operational frequency band of the Doherty amplifier, or a lumped equivalent circuit therefor.

Next, the present invention will be described by referring to the appended drawings, wherein.

Hereinafter, reference will be made to the appended drawings. It should be noted that identical reference signs may be used to refer to identical or similar components.

Figure 1:
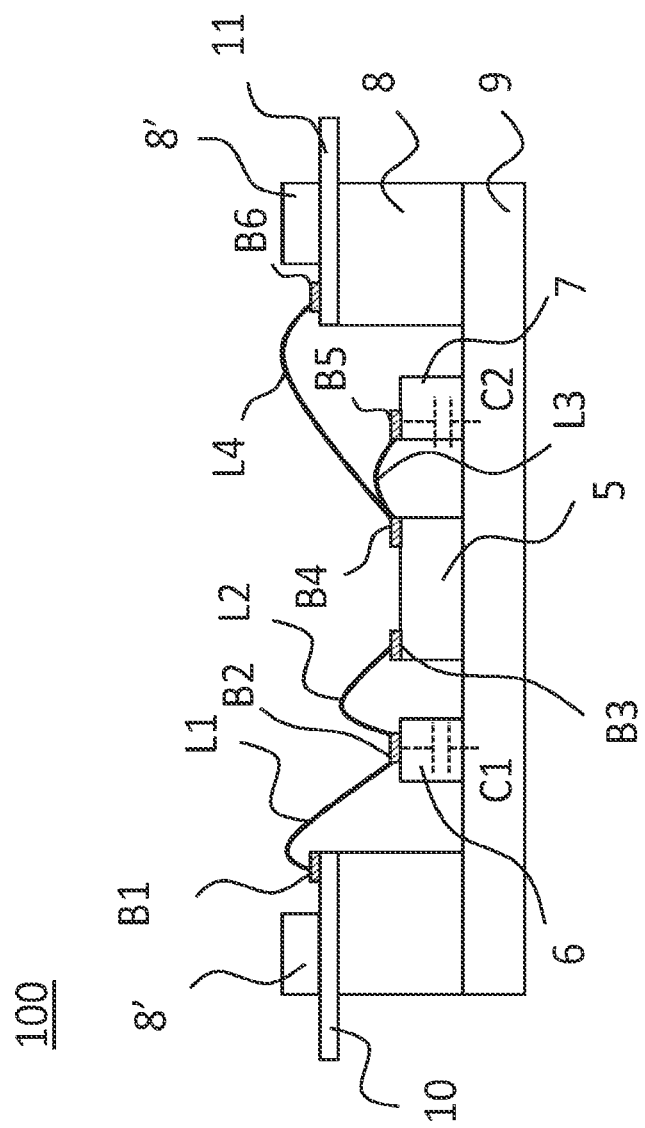
FIGS. 1 and 2 illustrate two examples of known amplifiers.
Figure 4:
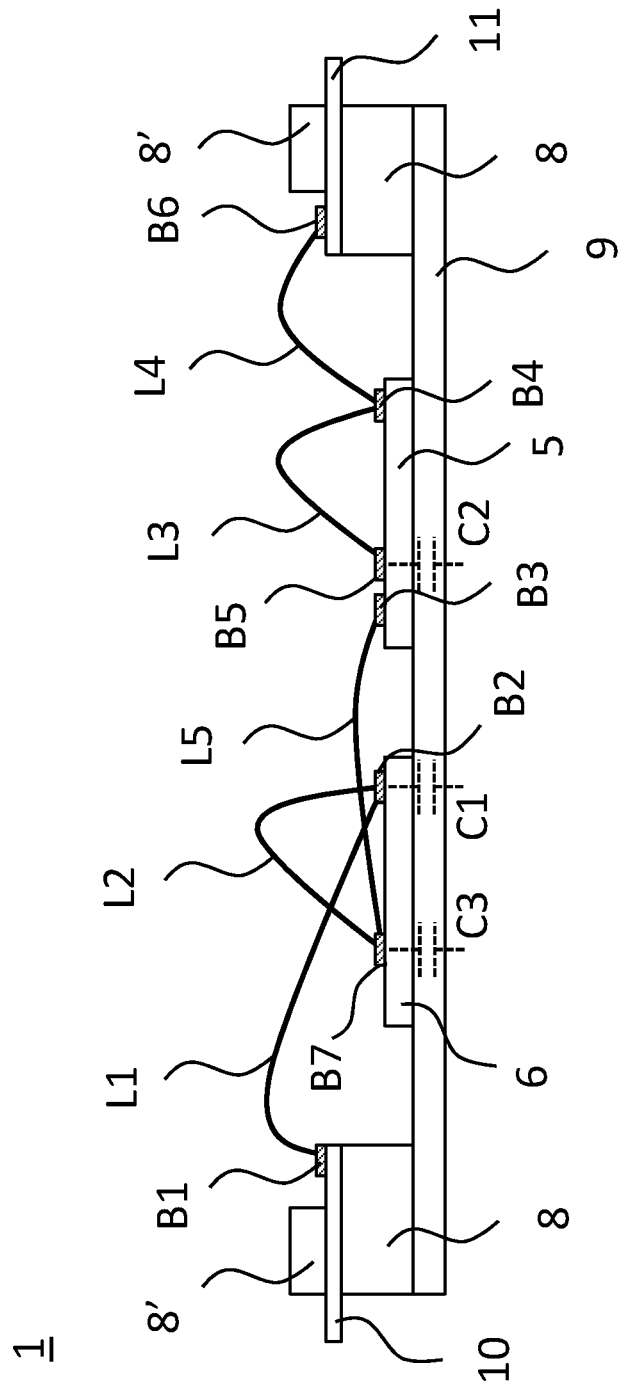
FIG. 4 illustrates a first embodiment of an amplifier in accordance with the present invention.
Figure 5:
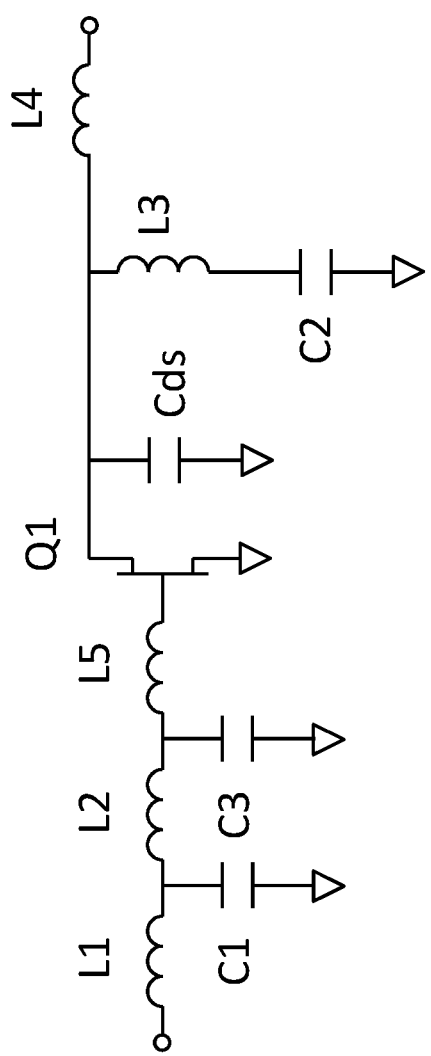
FIG. 5 illustrates the electrical equivalent circuit of the amplifier in FIG. 4.

FIG. 4 illustrates a first embodiment of an amplifier 1 in accordance with the present invention and FIG. 5 illustrates the corresponding equivalent circuit. Compared to amplifiers 100, 200 shown in FIGS. 1 and 2, respectively, amplifier 1 comprises an additional BAS, i.e. seventh BAS B7, and a second input matching capacitor C3. In FIG. 4, B2 is connected to the non-grounded terminal of C1 and B7 to the non-grounded terminal of C3. A bondwire assembly is used to connected B2 and B7. This bondwire assembly is referred to as L2 in FIGS. 4 and 5. In addition, bondwire assembly L5 is used to connect BAS B7 to BAS B3.

Now referring to FIG. 5, a current flowing through L1 from input terminal 10 will display a coupling coefficient with L3 having a given sign, i.e. positive or negative. By examining FIG. 4, it can be concluded that a coupling coefficient with this same sign will describe the coupling between L5 and L3. In both cases, the current is flowing in the same direction relative to L3. However, the coupling coefficient describing the coupling between L2 and L3 will have an opposite sign as the current flowing from B2 to B7 will flow in the opposite direction. This will produce the desired (at least partial) reduction of the electromagnetic coupling between the input matching network and L3.

Figure 6:
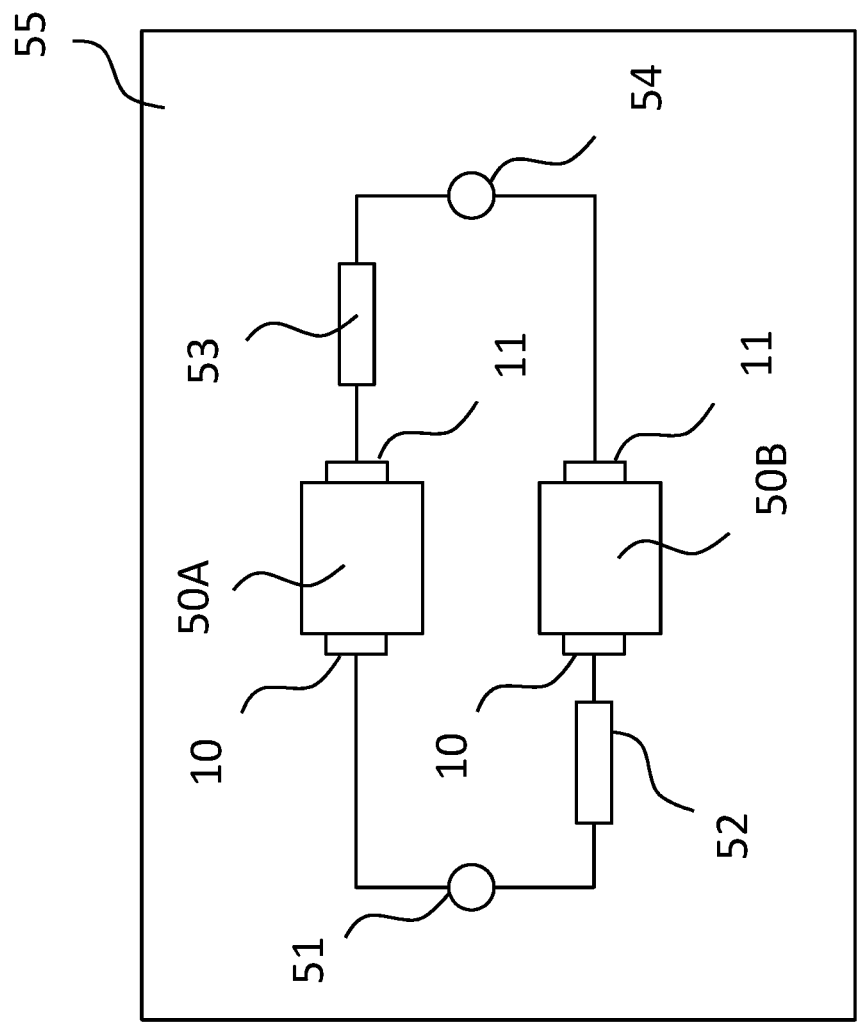
FIG. 6 illustrates an embodiment of a Doherty amplifier in accordance with the present invention.

FIG. 6 illustrates an embodiment of a Doherty amplifier 50 in accordance with the present invention. Amplifier 50 comprises a printed circuit board 55 on which two packaged amplifiers 50A, 50B are arranged. Each of amplifiers 50A, 50B may correspond to amplifier 1 shown in FIG. 4 or other embodiments of an amplifier in accordance with the present invention although amplifiers 50A, 50B may differ in the size of the transistor and the values of the various components.

Amplifier 50 comprises a splitter 51 that splits an input signal received at an input of amplifier 50 (not shown) into respective parts that are fed to packaged amplifiers 50A, 50B.

In FIG. 6, amplifier 50A corresponds to the main amplifier of Doherty amplifier 50 whereas amplifier 50B corresponds to the peak amplifier. A phase shifter 52 is included in the path from splitter 51 to amplifier 50B. In some embodiments, phase shifter 52 and splitter 51 are integrated into a single component such as a quadrature hybrid coupler having the input port thereof coupled to the input of Doherty amplifier 50, the through port thereof to main amplifier 50A, the forward coupled port thereof to the input of amplifier 50B, and the reverse coupled port thereof to a terminating resistance to prevent reflection back into the coupler.

At the output side, amplifier 50 comprises an impedance inverter 53, which typically comprises a transmission line of a given length or a lumped equivalent thereof. Impedance inverter 53 may act as and/or at least partially correspond to a quarter wavelength transmission line. More in particular, when the effective impedance seen by the impedance inverter at its output increases the effective impedance looking into the impedance inverter at its input decreases, and vice versa.

Impedance inverter 53 is arranged in between main amplifier 50A and combining element 54, which may correspond to a simple connection between the branches of main amplifier 50A and peak amplifier 50B. Phase shifter 52 and impedance inverter 53 are designed in such a way that the signals outputted by amplifiers 50A, 50B add in-phase at combining element 54.

Figure 7:
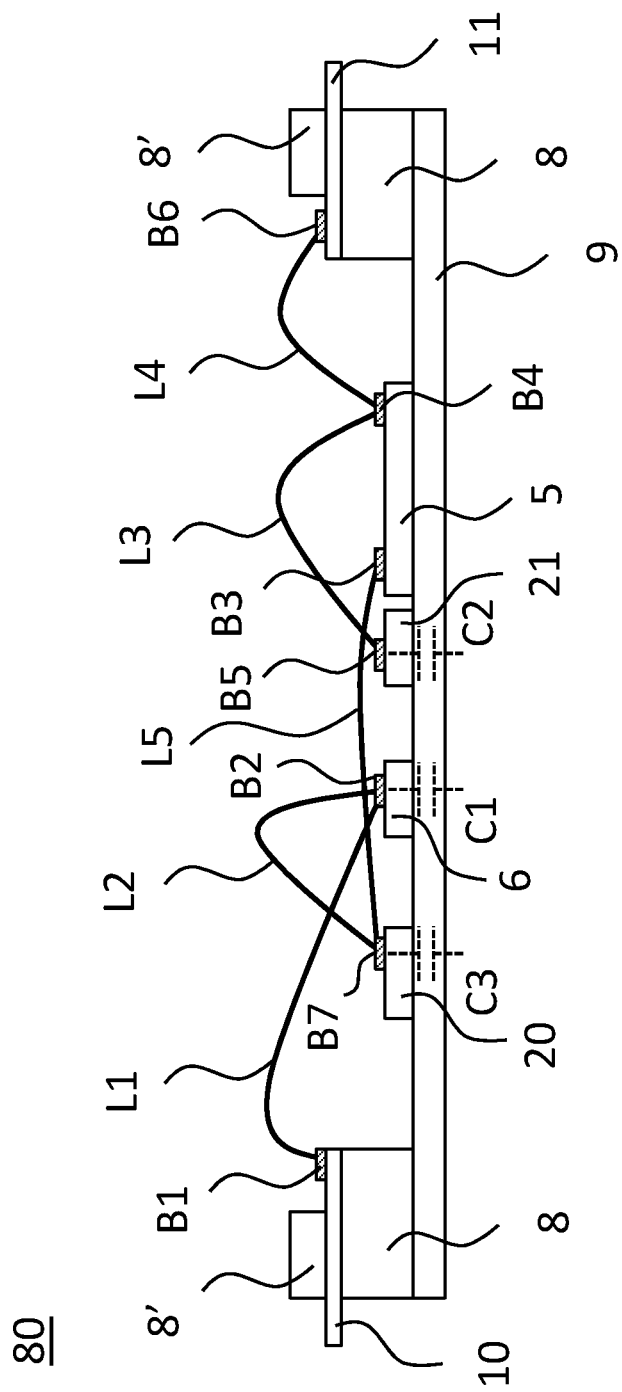
FIG. 7 illustrates a second embodiment of an amplifier in accordance with the present invention.

FIG. 7 illustrates a second embodiment of an amplifier 80 in accordance with the present invention. Comparing amplifier 80 to amplifier 1 shown in FIG. 4, it can be deduced that amplifier 80 comprises a third die 20 on which capacitor C3 is integrated and a fourth die 21 on which capacitor C2 is integrated. Dies 20, 21 may correspond to semiconductor dies, ceramic dies, or other technologies in which passive components can be realized. It should be noted that embodiments are also possible in which, compared to amplifier 1 shown in FIG. 4, only one of C2 and C3 is realized on a separate die.

Figure 2:
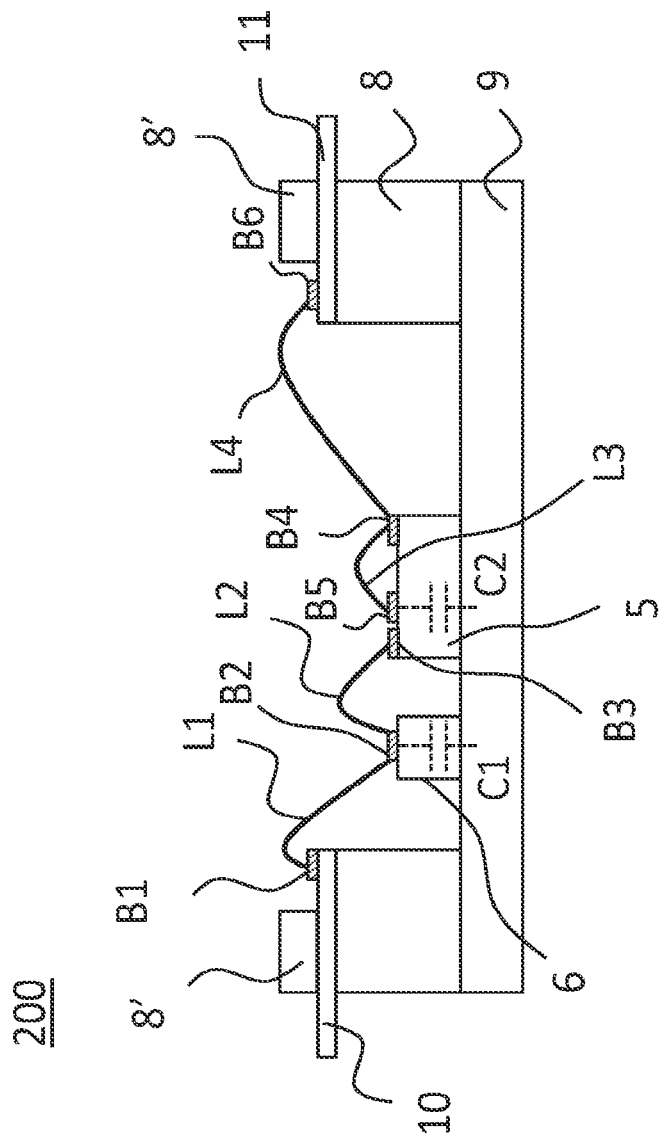
Figure 3:
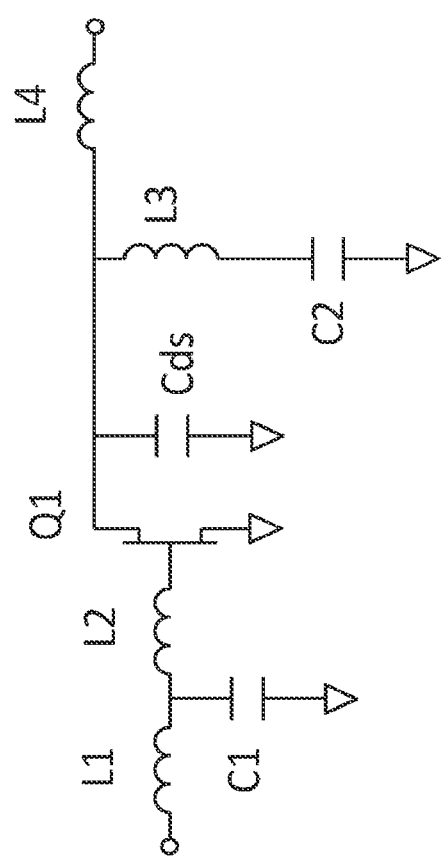
FIG. 3 illustrates the electrical equivalent circuit of the amplifiers in FIGS. 1 and 2.
Figure 8:
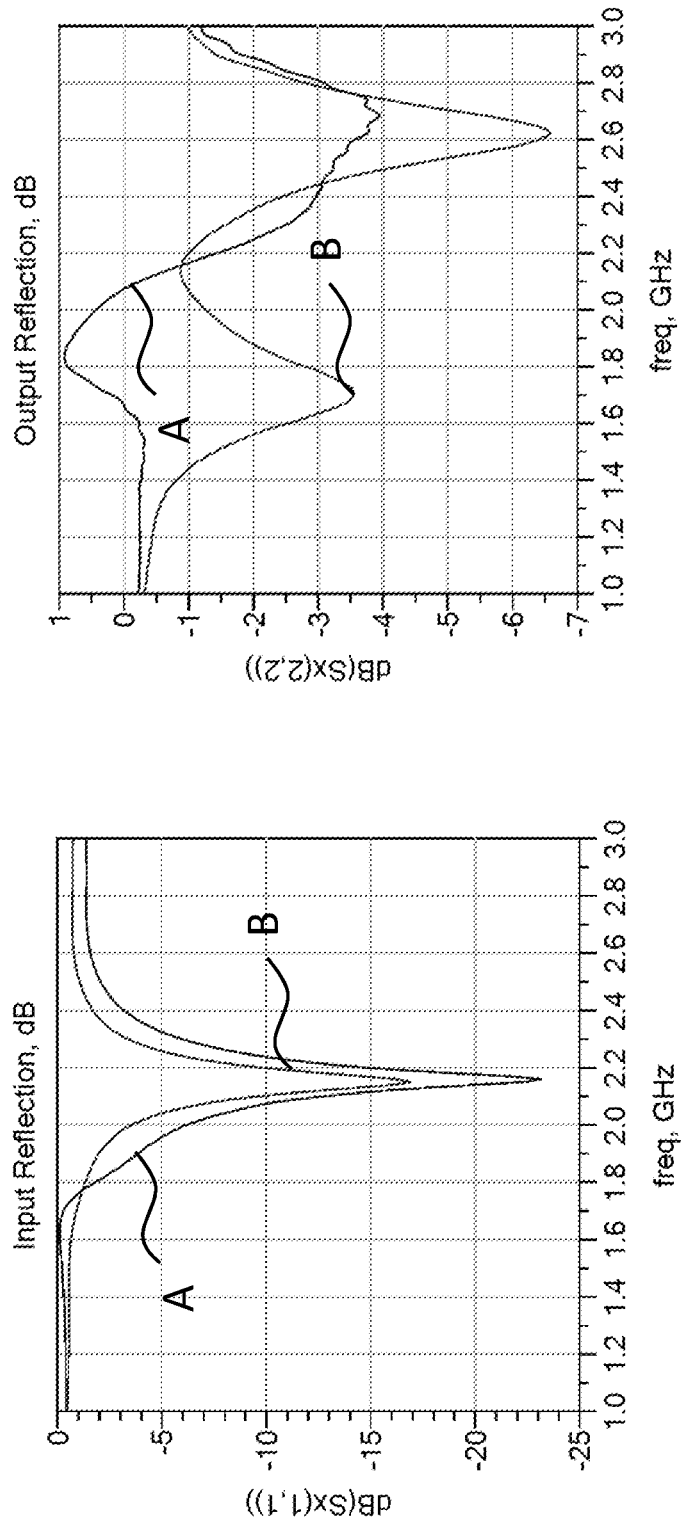
FIG. 8 illustrates a comparison between the RF performance of an amplifier as illustrated in FIG. 2 and an amplifier as illustrated in FIG. 4.

It should be noted that the order of bondwire attachment structures with respect to B1, B7, B2 is the same among amplifier 1 and amplifier 80. However, the order with respect to B5 and B3 is reversed. Amplifier 80 may therefore display a larger coupling coefficient between L5 and L3. FIG. 8 illustrates a comparison between the RF performance of an amplifier as illustrated in FIG. 2 (denoted by the letter 'A') and an amplifier as illustrated in FIG. 4 (denoted by the letter 13'). As can be seen, the reflection coefficient, i.e. S11, at the input for the amplifier illustrated in FIG. 2 has the tendency to become larger than 0 dB. This is indicative of oscillation. Similarly, the reflection coefficient, i.e. S22, at the output for the amplifier illustrated in FIG. 2 is larger than 0 dB in a frequency band around 1.8 GHz. Also, this is indicative of oscillation. As can be observed from FIG. 8, the reflection coefficients of the amplifier of FIG. 4 do not show this undesired behavior, thereby indicating a reduced risk of oscillation.

Figure 9:
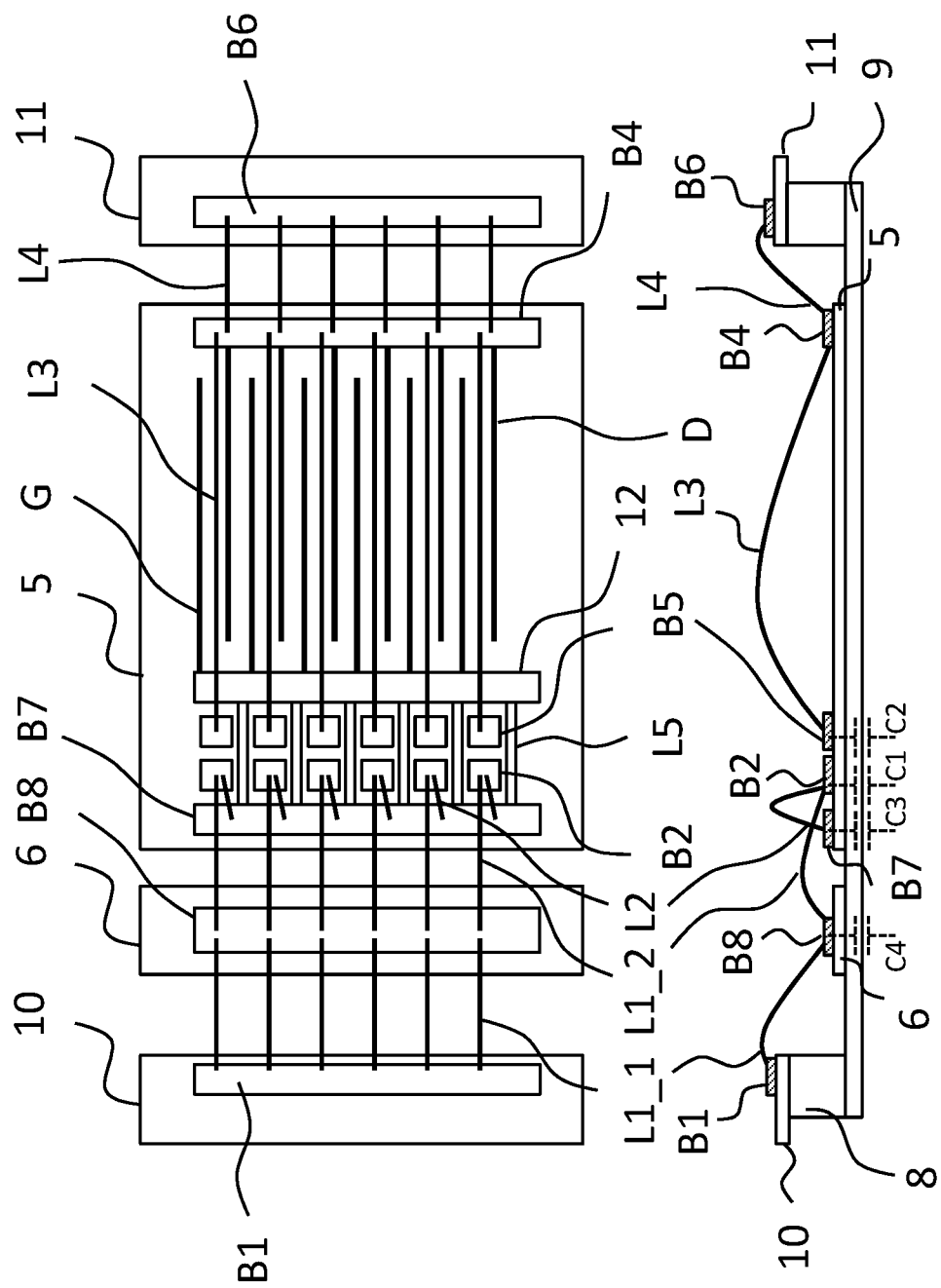
FIGS. 9 and 10 illustrate further embodiments of an amplifier in accordance with the present invention.
Figure 10:
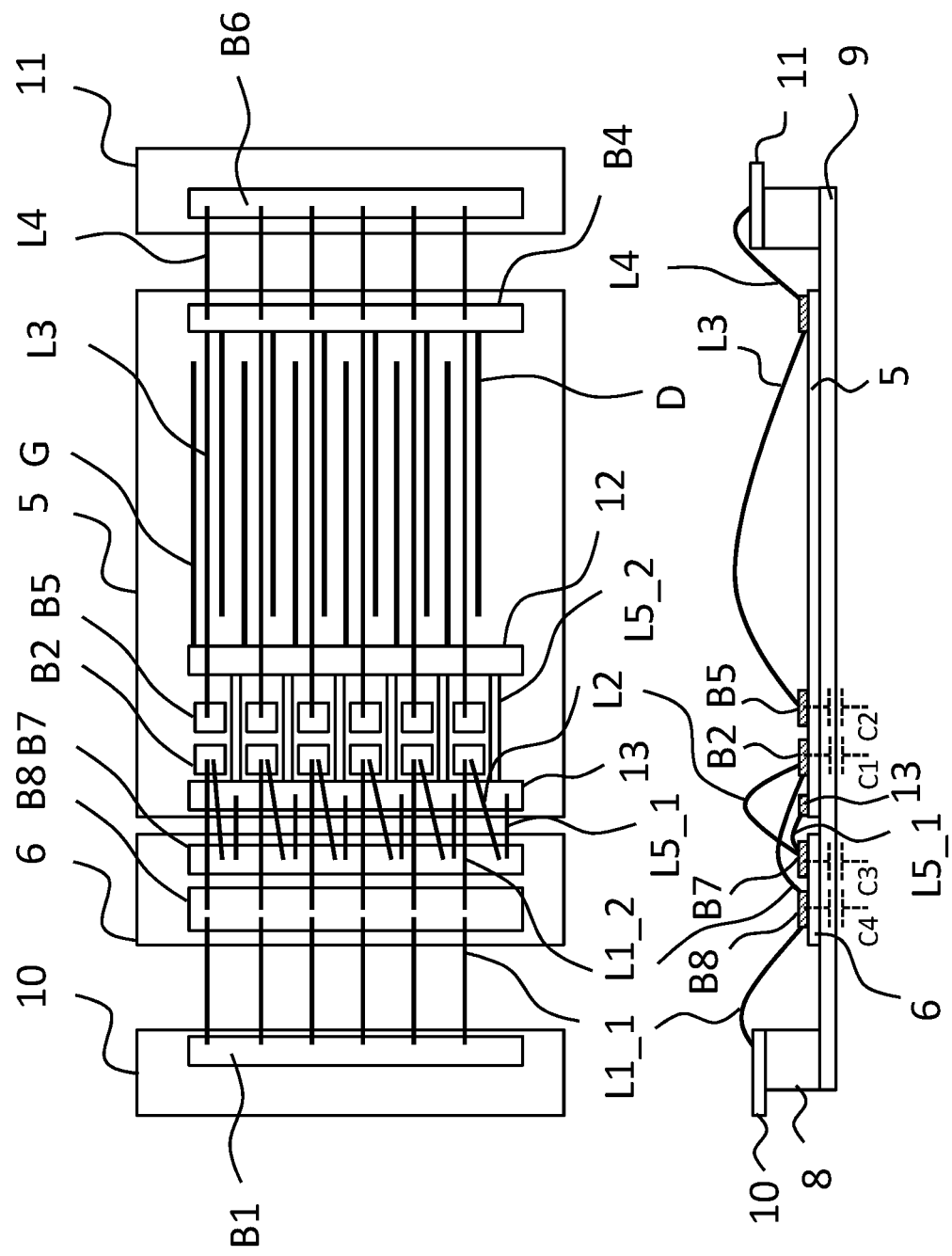

FIGS. 9 and 10 illustrate further embodiments of an amplifier in accordance with the present invention. Each of these figures illustrates a top view and a cross sectional side view. Compared to the embodiment of FIG. 4, the amplifiers in FIGS. 9 and 10 comprise an additional input matching stage. A grounded third input matching capacitor C4 is used of which the non-grounded terminal is connected to an eighth BAS B8. This capacitor is integrated on second die 6. First bondwires L1_1 connect first BAS B1 to eighth BAS B8 and second bondwires L1_2 connected eighth BAS B8 to second BAS B2.

In FIG. 9, second BAS B2, which is connected to the non-grounded terminal of capacitor C1, is connected to seventh BAS B7 using second bondwire assembly L2. In turn, seventh BAS B7 is connected to an input of the radiofrequency power transistor using a metal track L5. More in particular, metal tracks L5 connect seventh BAS B7 to a gate bar 12 from which gate fingers G extend.

In FIG. 9, second BAS B2 is formed using a plurality of bond pads. Each of these bond pads may be connected to a single large capacitor C1 or each bond pad is connected to a respective smaller capacitor, which smaller capacitors together form capacitor C1. The same holds for the bond pads that make up fifth BAS B5.

At the output of the radiofrequency power transistor, fourth BAS B4 is connected to or at least partially forms a drain bar from which drain fingers D extend.

In the FIG. 10 embodiment, capacitor C3 is integrated on die 6. Seventh BAS B7 is connected to second BAS B2 using second bondwire assembly L2. In addition, seventh BAS B7 is connected to gate bar 12 using bondwires 15_1, which connect seventh BAS B7 to bar 13, and metal tracks 15_2, which connect bar 13 to gate bar 12.

As shown in FIG. 10, a height of second bondwire assembly L2 is much higher than bondwires 15_1. For both figures, the inductance associated with second bondwire assembly L2 is higher than that of the inductance of the electrical connection. In FIG. 9, the electrical connection is mainly formed by metal tracks L5, whereas in FIG. 10, the electrical connection is formed by bondwires L5_1 and metal tracks L5_2.

The amplifier according to the invention introduces an additional design parameter, namely the shapes and size of the various bondwire assemblies in the input network, to improve stability of the amplifier and/or to obtain a better trade-off between key design parameters such as bandwidth, stability, gain, and efficiency. The amplifiers are not limited to a particular type of transistor, such as field-effect transistors or bipolar transistors, or to a particular material system in which the transistor is realized. For example, the amplifier could be realized in Silicon based laterally diffused metal-oxide semiconductor, 'LDMOS', transistors or as a Gallium Nitride based high electron mobility transistors, 'HEMT'.

Furthermore, the present invention is not limited to particular packaging technology and could relate to ceramic packages, overmolded packages, quad flat no lead package, or the like.

Finally, although the present invention has been described using detailed embodiments thereof, it should be noted that the invention is not limited to these embodiments but that the scope of the invention is defined by the appended claims and their equivalents.

The invention claimed is:
1. An amplifier comprising:
a conductive substrate;
an input terminal arranged spaced apart from the conductive substrate;
a first bondwire attachment structure electrically connected to or integrally formed with the input terminal;
a first input matching capacitor having a non-grounded terminal and a grounded terminal;
a second BAS electrically connected to the non-grounded terminal of the first input matching capacitor;
a first semiconductor die on which a radiofrequency power transistor is arranged that has an output electrically connected to a fourth BAS;
an output matching capacitor having a non-grounded terminal and a grounded terminal, the non-grounded terminal being electrically connected to a fifth BAS;
an output terminal arranged spaced apart from the conductive substrate;
a sixth BAS electrically connected to or integrally formed with the output terminal;
a first bondwire assembly for providing an electrical connection between the first BAS and the second BAS;
a second bondwire assembly for providing an electrical connection between the second BAS and an input of the radiofrequency power transistor;
a third bondwire assembly extending between the fourth BAS and the fifth BAS and providing an electrical connection between the fourth BAS and the fifth BAS;
a fourth bondwire assembly for providing an electrical connection between the fourth BAS and the sixth BAS,
wherein, in a direction from the input terminal to the output terminal, the fifth BAS is arranged in between the second BAS and the fourth BAS, and the fourth BAS is arranged in between the fifth BAS and the sixth BAS;
a second input matching capacitor having a non-grounded terminal and a grounded terminal the non-grounded terminal being connected to a seventh BAS; and
an electrical connection between the seventh BAS and the input of the radiofrequency power transistor,
wherein the second bondwire assembly extends between the second BAS and the seventh BAS,
wherein an inductance associated with the second bondwire assembly is greater than an inductance associated with the electrical connection, and
wherein the seventh BAS is arranged, in the direction from the input terminal to the output terminal, in between the first BAS and the second BAS.

2. The amplifier according to claim 1, wherein an inductance of the electrical connection is such that an impedance transformation ratio between the real part of an impedance seen looking into the electrical connection towards the radiofrequency power transistor and the real part of an impedance looking into an input of the radiofrequency power transistor is less than one fifth of an impedance transformation ratio between the real part of an impedance seen looking into the second bondwire assembly towards the radiofrequency power transistor and the real part of an impedance looking into an input of the radiofrequency power transistor.

3. The amplifier according to claim 1, wherein the radiofrequency power transistor is realized in Silicon based laterally diffused metal-oxide semiconductor (LDMOS) transistors or as a Gallium Nitride based high electron mobility transistors (HEMT).

4. The amplifier according to claim 1, wherein a total gate width of the radiofrequency power transistor lamer than 1 mm, wherein an operational frequency of the amplifier lies in a range between 100 MHz and 40 GHz, and wherein an output power of the amplifier exceeds 50 W.

5. The amplifier according to claim 1, wherein the amplifier is designed to be operable in alt operational frequency band, wherein the series connection of the output matching capacitor and the third bond assembly is configured to resonate w output capacitance of the radiofrequency power transistor at or near an operational frequency within the operational frequency band.

6. The amplifier according to claim 1, wherein the first bondwire assembly extends between the first BAS and the second BAS.

7. The amplifier according to claim 1, wherein the fourth bondwire assembly extends bet wen the fourth BAS and the sixth BAS.

8. The amplifier according to claim 1, further comprising a second die on which the first input matching capacitor and second input matching capacitor are integrated.

9. The amplifier according to claim 1, further comprising a second die and a third die on which the first input matching capacitor and the second input matching capacitor are integrated, respectively.

10. The amplifier according to claim 1, further comprising a second die on which the second input matching capacitor is integrated, wherein the first input matching capacitor is integrated on the first semiconductor die.

11. The amplifier according to claim 10, wherein the output matching capacitor is integrated on the second die.

12. The amplifier according to claim 10, further comprising a fourth die on which the output matching capacitor is integrated, wherein the fourth die is arranged in between the second die and the first semiconductor die.

13. The amplifier according to claim 10, further comprising a third input matching capacitor having a grounded terminal and a non-grounded terminal that is connected to an eighth BAS wherein the first bondwire assembly comprises first bondwires extending between the first BAS and the eighth BAS and second bondwires extending between the eighth BAS and the second BAS.

14. The amplifier according to claim 13, wherein the third input matching capacitor is integrated on the second die or the first semiconductor die.

15. The amplifier according to claim 1, wherein the output matching capacitor is integrated on the first semiconductor die.

16. The amplifier according to claim 1, wherein the second input matching capacitor is integrated on the first semiconductor die.

17. The amplifier according to claim 1, wherein the first input matching capacitor, the second input matching capacitor, and the output matching capacitor are integrated on the first semiconductor die.

18. The amplifier according to claim 17, wherein the electrical connection comprises a metal track arranged on the first semiconductor die that extends from the non-grounded terminal of the second input matching capacitor to the input of the radiofrequency power transistor.

19. The amplifier according to claim 17, wherein the input of the radiofrequency power transistor is electrically connected to a third BAS, and wherein the electrical connection comprises a fifth bondwire assembly extending between the seventh BAS and the third BAS.

20. The amplifier according to claim 19, wherein the second BAS is arranged in between the first BAS and the third BAS.

* * * * *